United States Patent [19]
Fukuda et al.

[11] Patent Number: 5,667,585
[45] Date of Patent: Sep. 16, 1997

[54] METHOD FOR THE PREPARATION OF WIRE-FORMED SILICON CRYSTAL

[75] Inventors: Tsuguo Fukuda, Sendai; Susumu Sakaguchi, Kawasaki; Tadashi Kamioka, Kawasaki; Toru Yamada, Kawasaki; Teruhiko Hirasawa, Kawasaki, all of Japan

[73] Assignee: Shin-Etsu Chemical Co., Ltd., Tokyo, Japan

[21] Appl. No.: 579,350

[22] Filed: Dec. 27, 1995

[30] Foreign Application Priority Data

Dec. 27, 1994 [JP] Japan ................................. 6-325903
Dec. 27, 1994 [JP] Japan ................................. 6-326012

[51] Int. Cl.$^6$ ................................................. C30B 28/08
[52] U.S. Cl. ......................... 117/49; 117/52; 117/75; 117/87
[58] Field of Search ........................ 117/2, 37, 48, 117/49, 52, 75, 87, 921, 33, 932

[56] References Cited

U.S. PATENT DOCUMENTS

| | | | |
|---|---|---|---|
| 4,040,890 | 8/1977 | Burrus, Jr. et al. | 127/921 |
| 4,421,721 | 12/1983 | Byer et al. | 422/109 |
| 4,863,526 | 9/1989 | Miyazawa et al. | 148/3 |
| 4,866,230 | 9/1989 | Ikeda et al. | 219/10.43 |

OTHER PUBLICATIONS

8347 Materials Science and Engineering B, vol. B04, Nos. 1/04; 1 Oct. 1989, pp. 1–10, XP000095483; Werner Zulehner; "Status and Future of Silicon Crystal Growth".

*Primary Examiner*—Felisa Garrett
*Attorney, Agent, or Firm*—David E. Dougherty

[57] ABSTRACT

Proposed is a low-cost method for the preparation of a wire-formed crystal of silicon having a diameter of 1 mm or smaller, in which a vertically held starting rod of silicon is melted at one end portion by high-frequency induction heating, a seed crystal is brought into contact with the molten portion and then the seed crystal and the starting silicon rod are pulled apart in the vertical direction at a controlled velocity with a controlled high-frequency power input so that the melt of silicon drawn by the seed crystal is solidified and crystallized into the form of a wire.

13 Claims, 1 Drawing Sheet

METHOD FOR THE PREPARATION OF WIRE-FORMED SILICON CRYSTAL

BACKGROUND OF THE INVENTION

The present invention relates to a method for the preparation of a wire-formed silicon crystal having a diameter of 1 mm or smaller or, in particular cases, 0.8 mm or smaller or, in more particular cases, 0.5 mm or smaller which is useful as a wave guide for light having a wavelength in the infrared region as well as in the application fields such as low-cost solar cells, strain gauges, micromachines and the like.

As is well known, silicon as a semiconductor material is widely used as a principal material in the electronic and optoelectronic devices and the importance thereof is increasing year by year as a key material supporting the information-predominant society in the present and future days. Semiconductor materials of silicon currently under practical applications in the manufacture of electronic devices is almost exclusively a single crystal in the form of a wafer which is prepared in a process in which polycrystalline silicon having an extremely high purity is used as a starting material from which a single crystal rod of silicon having accurately controlled quality is grown by the so-called Czochralski (CZ) process or floating zone-melting (FZ) process and the thus obtained single crystal rod of silicon is sliced perpendicularly to the growing axis. Since the productivity of semiconductor devices from such a silicon wafer can be improved by the use of a silicon wafer having an increased diameter, an outstanding trend in the CZ or FZ process is to produce a single crystal rod of silicon having a larger and larger diameter to be at a stage of practical production of a single crystal rod of 8-inches diameter and single crystal rods of silicon having a diameter of 12 inches or even larger are now under development.

The largest problem in the above described conventional process is that the single crystal rod of semiconductor silicon can be produced only at a very high cost and, in addition, the step of slicing of the single crystal rod to prepare wafers is unavoidably accompanied by a large material loss due to the slicing margins resulting in an increase in the overall production costs of semiconductor silicon wafers as a bottleneck when cost reduction is required for various semiconductor devices.

Along with the trend in recent years toward higher and higher performance and function required in electronic devices, on the other hand, the devices must have a finer and finer structure. A technological approach to meet these requirements is utilization of the semiconductor silicon material in the form of a thin film to constitute one of the major currents in the material technology. The progress in the technology for the preparation of thin-film semiconductor silicon serves to the development of important application fields in the direction for the availability of larger and larger liquid crystal display panels and solar cells. When consideration is made for the optical applications of semiconductor silicon or for the above mentioned problem of the kerf loss in the preparation of wafers by slicing, it would be a promising way to have a silicon semiconductor material in the form of a thin wire or filament. Nevertheless, the technological efforts for the manufacture of wire-formed materials are heretofore limited to oxides and halides only and no reports are available on the preparation of wire-formed silicon single crystals. These situations have driven the inventors to conduct extensive investigations for the development of a preparation method of a wire-formed silicon crystal.

SUMMARY OF THE INVENTION

The present invention accordingly has an object to provide a novel and reliable method for the preparation of crystalline silicon in the form of a wire or filament having a diameter not exceeding 1 mm or, in particular cases, not exceeding 0.8 mm or, in more particular cases, 0.5 mm or smaller.

Thus, the method of the present invention for the preparation of silicon in the form of a wire having a diameter not exceeding 1 mm comprises the steps of:

(a) holding a rod of silicon in a vertical disposition;

(b) melting an end portion of the vertically held rod of silicon by heating with high frequency induction;

(c) bringing a seed crystal of silicon into contact with the molten end portion of the vertically held rod of silicon to cause melt-bonding therebetween; and (d) pulling apart the seed crystal and the vertically held rod of silicon in the vertical direction relative to each other so as to effect solidification and crystallization of the molten silicon as drawn by the seed crystal.

The above defined method of the present invention is referred to as the MFZ (microfloating zone) process hereinafter.

In particular, the diameter of the wire-formed single crystal of semiconductor silicon, which can be as small as one hundredth of the diameter of the vertically held starting rod of silicon, can be controlled by adjusting the high-frequency electric power and/or the velocity for pulling apart the seed crystal and the vertically held rod of silicon.

DETAILED DESCRIPTION OF THE PREFERRED EMBODIMENTS

Figure 1:
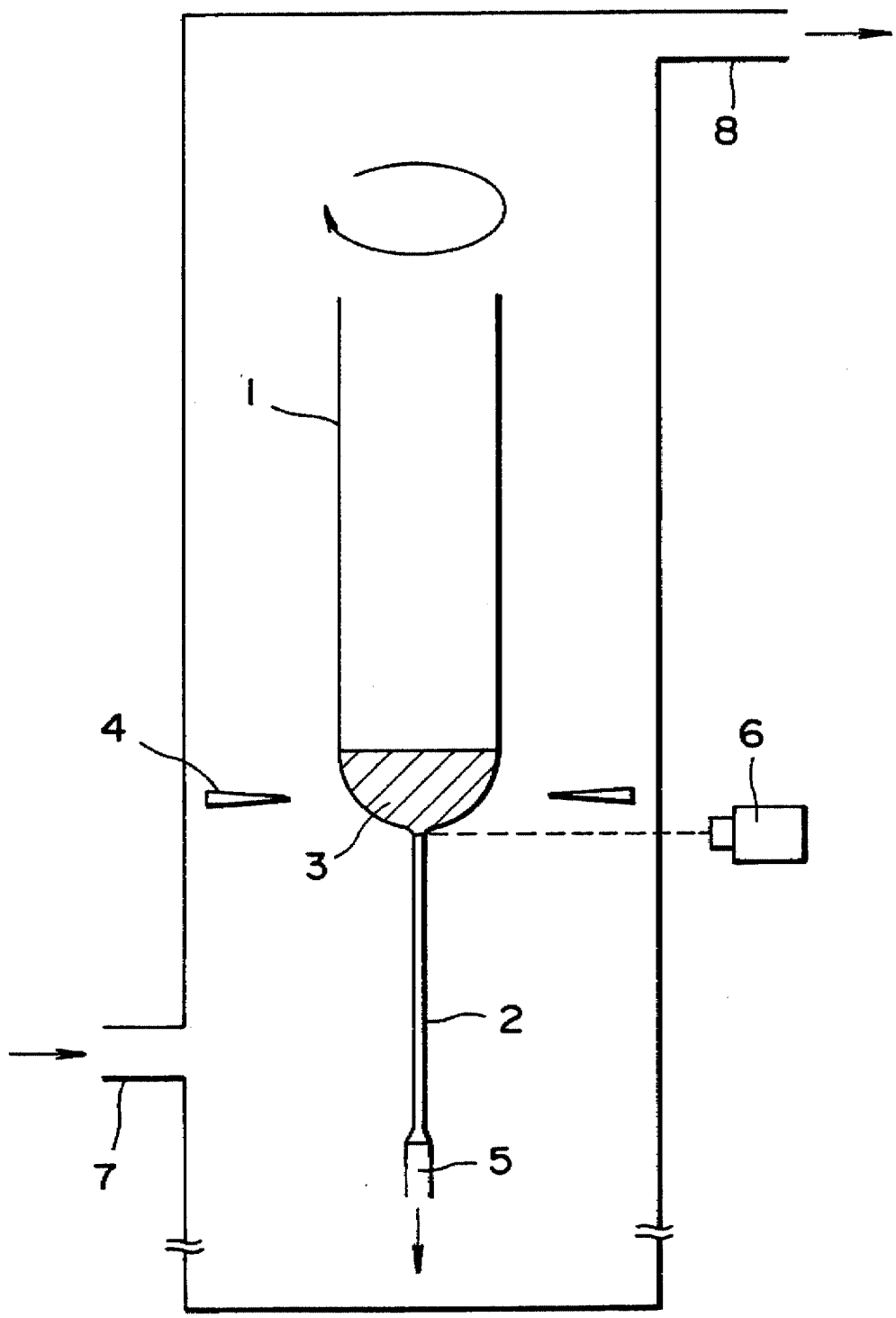
FIG. 1 is a schematic illustration of an apparatus for practicing the inventive process for the preparation of silicon in the form of a wire by a vertical cross sectional view of the apparatus.

The inventors first attempted to grow a wire-formed crystalline silicon having a diameter not exceeding 1 mm or, in particular cases, not exceeding 0.8 mm or, in more particular cases, not exceeding 0.5 mm by melting silicon in a crucible having an orifice at the bottom, bringing a seed crystal of silicon into contact with the melt of silicon appearing out from the orifice on the bottom of the crucible, and pulling down the seed crystal as the molten silicon is solidified and grows in the form of a wire. This method is referred to as the MPD method or micro pulling-down method hereinafter. In practicing this MPD method, silicon is melted in a crucible made from a refractory material of a high melting point by high-frequency induction heating in which high-frequency electric current is passed through a coil installed to surround the crucible and the melt of silicon is pulled down through the orifice in the bottom wall of the crucible by means of a seed crystal in contact with the melt to be cooled and crystallized by gradually descending the seed crystal at a controlled rate using a driving mechanism for pulling down while the state of the solid-liquid interface is monitored using a CCD camera to adjust the diameter and growing velocity of solid silicon in the form of a wire with very high stability by means of controlling the driving mechanism for pulling down and/or the high-frequency electric power for heating.

In the above described MPD method by the use of a crucible, however, it is almost impossible to completely prevent contamination of the silicon by the material forming the crucible so that the purity of the wire-formed silicon is limited and cannot be very high. When a crucible made from a carbonaceous material is used, for example, it is sometimes the case to detect that the wire-formed silicon thus obtained contains carbon as an impurity in an amount to correspond to the upper limit of solid solubility of carbon in silicon.

The above described problem in the prior art provided the inventors with motivation to develop a method for the preparation of a wire or filament of silicon without using a crucible. In the method of the present invention, namely, a rod of silicon is held in a vertical disposition and the end portion thereof is melted by high-frequency induction heating to form a melt of silicon to which a seed crystal of silicon is brought into contact followed by pulling apart the starting rod of silicon and the seed crystal carrying the melt relative to each other in the vertical direction at such a controlled velocity that the melt of silicon adhering to the seed crystal is solidified to form a wire or filament of silicon having a diameter not exceeding 1 mm.

Needless to say, the so-called FZ (floating zone melting) method is well known and industrially practiced as a method for growing a single crystal of silicon without use of a crucible. The conventional FZ method, however, has been developed as a process for the preparation of a single crystal rod of silicon having a relatively large diameter so that this method or the apparatus therefor cannot be applied to the preparation of a wire or filament of silicon.

As a crystal growing method for a substance having a high melting point such as oxides without using a crucible, so-called the pedestal method and FZ method by heating with a laser beam are known and actually practiced for single crystal growing of limited kinds of materials. These methods, however, are very inefficient in practice for the preparation of a wire-formed single crystal of semiconductor silicon because the laser beam for heating in the wavelength region under current use is not suitable for melting silicon and no successful results have been obtained by this method.

In the method of the present invention, in contrast thereto, a rod of starting silicon is held in a vertical disposition and the end portion or, preferably, lower end thereof is melted by high-frequency induction heating followed by melt-bonding of a seed crystal brought into contact with the molten portion of the silicon rod. Thereafter, the silicon rod and the seed crystal are pulled apart relative to each other in the vertical direction at a controlled velocity so that the thread of the molten silicon drawn out of the molten portion of the silicon rod is cooled to be solidified and crystallized into a wire-formed crystal of silicon having a diameter not exceeding 1 mm. The present invention has been completed after establishment of the conditions which enable stable growing of a wire-formed crystal of silicon without using a crucible after conducting trial-and-error experiments on the diameter of the starting silicon rod and the means for the exact control of the diameter of the wire-formed crystal to be grown as well as on the growing velocity.

Namely, it has been found that stable growth of a wire-formed crystal of silicon having a diameter of 1 mm or smaller can be successfully performed with stability only when the ratio of the diameter of the starting silicon rod and the diameter of the wire-formed crystal under growing is in the range from 1:1 to 100:1 or, preferably, from 5:1 to 20:1.

It has been also found that an advantageous effect can be obtained for the stable growth of a wire of silicon by rotating either one or both of the starting silicon rod and the growing wire of silicon around the vertical axis. The relative velocity of revolution between the silicon rod and the growing wire of silicon is 200 rpm or lower or, preferably, 30 rpm or lower. When both of the silicon rod and the growing wire of silicon are brought into rotation, the direction of the revolution of them can be the same or reverse to each other.

Needless to say, the rod of silicon as the starting material can be polycrystalline or single-crystalline. The quality relative to the purity of the starting silicon rod naturally has a great influence on the characteristics of the wire or filament of silicon as grown. It is noteworthy that, since the proportion of the surface area of the wire-formed silicon to the volume thereof is much larger than in the starting silicon rod having a larger diameter, vaporizable impurities contained in the starting silicon rod is removed by vaporization throughout the growing process and point defects and dislocations are also dissipated outwardly to facilitate obtaining a crystallized silicon having a very high purity and very high quality relative to the crystalline defects. Nevertheless, it is desirable that the impurity content in the starting silicon rod does not exceed 0.1 atomic % because a wire-formed crystalline silicon of high purity can hardly be obtained from a starting silicon rod of which the impurity content is too high even by the above mentioned beneficial effect for the removal of impurities. Different from the MPD process using a crucible, the process according to the invention does not use any crucibles so that the purity content in the wire-formed crystalline silicon is mainly determined by the impurity content in the starting silicon rod. When the starting silicon rod has a purity of polycrystalline silicon of the solar cell grade or semiconductor grade available on the market, good purity is ensured of the wire-formed crystalline silicon and the total content of oxygen and carbon therein can be as low as 100 ppma or lower and the total content of copper, nickel and iron as the metallic impurities can be as low as 50 ppma or lower.

Contamination of the growing wire-formed crystalline silicon can also take place from the atmosphere under which the growing process is undertaken. When a wire-formed crystalline silicon of an extremely high purity is desired, the growing process is performed under a reduced pressure of 1 Torr or lower or, preferably, $10^{-3}$ Torr or lower or, alternatively, performed under an atmosphere of an inert gas such as argon, helium, nitrogen and the like of which the content of active gases as impurities such as oxygen, hydrogen and hydrocarbons does not exceed 1000 ppm. The content of moisture in the atmospheric gas should desirable be limited not to exceed $10^{-3}$ atmosphere calculated as the vapor pressure at 25° C.

It is of course that the electric properties, e.g., type of electro-conductivity and resistivity, of the wire-formed crystalline silicon as grown can be freely controlled by the use of a starting silicon rod containing a dopant capable of giving an n-type silicon or p-type silicon in an appropriate doping level or, alternatively, by the use of an atmospheric gas containing a gaseous compound of these dopant elements such as diborane, phosphine and the like. When a wire-formed crystal of silicon of the n-type is desired, the dopant element to be introduced is selected from the Group V elements of the Periodic Table such as phosphorus, arsenic and antimony while, when that of the p-type is desired, the dopant element is selected from the Group III elements such as boron, aluminum and gallium. When a relatively low resistivity of 0.001 ohm·cm or lower is desired of the wire-formed crystalline silicon, it is preferable that the dopant element is phosphorus or boron in respect of their relatively high solubility thereof in solid silicon.

The diameter and/or the growing velocity of the wire-formed crystal of silicon according to the present invention can be controlled with high stability and accuracy by monitoring the shape and size of the solid-liquid interface at which the melt of the starting silicon is solidified and crystallized into the wire-formed silicon by using, for example, a CCD camera and by making a feed-back of the variation in the parameters to the high-frequency electric power and/or to the driving mechanism for the relative movement of the starting silicon rod and the wire-formed crystalline silicon under growing.

It is of course that the crystallographic orientation of the thus obtained wire-formed crystalline silicon coincides with that of the seed crystal on which the wire-formed crystal of silicon is grown. Namely, a wire-formed crystal of silicon of which the crystallographic orientation along the axis of the wire is, for example, <111>, <100>, <110>, <211>, <311> or <511> can be obtained by the use of a seed crystal in the form of a rod having the same crystallographic axial orientation. Further, when a seed crystal rod of which the crystallographic orientation in the axial direction deviates from the above mentioned indices is used, the wire-formed crystalline silicon also has a crystallographic orientation inclined from the index by the same deviation and a wire-formed crystal can be obtained with stability provided that the deviation does not exceed 25° at the largest. When this is the case, stability in the growing of the wire-formed crystal is ensured even in the occurrence of disturbance of the crystallographic orientation in the wire-formed silicon under growing.

The wire-formed crystal of semiconductor silicon prepared according to the inventive method has good mechanical properties suitable for fabrication into working elements of various mechanical parts. In an example, a wire-formed single crystal silicon having a diameter of 1 mm or smaller may have a tensile strength of at least 6 kgf/mm$^2$.

In the following, the method of the present invention is described in more detail by way of examples.

EXAMPLE 1

A rod 1 of polycrystalline silicon containing 1 ppma of impurities and having a diameter of 10 mm and a length of 120 mm was held in the vertical disposition in a crystal growing furnace illustrated in FIG. 1 by a vertical cross sectional view and rotated at a velocity of 20 rpm. The lower end portion 3 of this polycrystalline silicon rod 1 was melted by heating with high-frequency induction with supply of a high-frequency electric power to the high-frequency induction coil 4. A seed crystal 5 having a diameter of 1 mm, of which the crystallographic orientation in the axial direction was <111>, was held in a vertical disposition and brought from below into contact with the molten portion 3 of the polycrystalline silicon rod 1. After establishment of intimate solid-liquid melt-bonding between the seed crystal 5 and the melt of silicon 8, the seed crystal 5 was moved downwardly at an average descending velocity of 10 mm/minute so that the melt of silicon 3 was drawn down on the seed crystal 5 to form a solidified and crystallized wire-formed silicon 2 having a diameter of 0.5 mm and a length of 400 mm, of which the crystallographic orientation in the lengthwise direction was <111>, under monitoring of the solid-liquid interface by means of a CCD camera 6 so as to facilitate adjustment of the pulling-down velocity of the seed crystal 5 and the high-frequency electric power input to the high-frequency induction coil 4.

The atmosphere inside of the furnace was kept under a reduced pressure of 1 Torr by introducing argon gas containing 10 ppm of diborane at a flow rate of 2 liters/minute from the gas inlet port 7 with concurrent evacuation from the gas discharge port 8.

EXAMPLE 2

A rod of polycrystalline silicon containing less than 0.1 ppma of oxygen, less than 0.1 ppma of carbon, less than 0.001 ppma of copper, less than 0.1 ppma of nickel and less than 0.01 ppma of iron and having a diameter of 3 mm and a length of 120 mm was held in the vertical disposition within a crystal growing furnace illustrated in FIG. 1 and the lower end thereof was melted by high-frequency induction heating while the silicon rod was rotated at a velocity of 20 rpm. A seed crystal having a diameter of 1 mm, of which the crystallographic orientation in the axial direction was <110>, was held in a vertical disposition and brought from below into contact with the molten portion of the polycrystalline silicon rod. After establishment of intimate solid-liquid melt-bonding between the seed crystal and the melt of silicon, the seed crystal was moved downwardly at an average descending velocity of 5 mm/minute so that the melt of silicon was drawn down on the seed crystal to form a solidified and crystallized wire-formed silicon having a diameter of 0.350±0.012 mm and a length of 250 mm, of which the crystallographic orientation in the lengthwise direction was <110>, under monitoring of the solid-liquid interface by means of a CCD camera so as to facilitate adjustment of the pulling-down velocity of the seed crystal and the high-frequency power input to the high-frequency induction coil in order to accomplish a target diameter 0.350 mm of the wire-formed single crystal silicon.

The atmosphere inside of the furnace was kept under a pressure of 1.05 atmospheres by passing argon gas containing 10 ppm of diborane as a dopant at a flow rate of 2 liters/minute from the gas inlet port under restriction of the gas discharge port.

The thus obtained wire-formed single crystal silicon contained less than 0.1 ppma of oxygen, less than 0.1 ppma of carbon, less than 0.001 ppma of copper, less than 0.1 ppma of nickel and less than 0.01 ppma of iron and the crystallographic orientation in the lengthwise direction was <110>. The resistivity thereof was 0.4 ohm·cm and the tensile strength was 6.3 kgf/mm$^2$.

EXAMPLE 3

The experimental procedure was substantially the same as in Example 2 except that the seed crystal had a crystallographic axial orientation of <511> in the axial direction. The wire-formed crystalline silicon having a diameter of 0.54±0.020 mm also had a crystallographic orientation of <511> in the lengthwise direction. The resistivity thereof was 0.1 ohm·cm and the tensile strength was 8.0 kgf/mm$^2$. The contents of impurities therein were just the same as in Example 2.

EXAMPLE 4

The experimental procedure was substantially the same as in Example 2 except that the seed crystal had a crystallographic axial orientation of <111> in the axial direction. The wire-formed crystalline silicon having a diameter of 0.36±0.010 mm also had a crystallographic orientation of <111> in the lengthwise direction. The resistivity thereof was 0.5 ohm·cm and the tensile strength was 6.5 kgf/mm$^2$. The contents of impurities therein were just the same as in Example 2.

COMPARATIVE EXAMPLE 1

A graphite crucible having an inner diameter of 10 mm and depth of 110 mm and provided at the cortically formed bottom with an orifice having a diameter of 0.3 mm was charged with 1.0 g of solar cell-grade silicon particles of 0.1 to 1 mm diameter containing 70 ppma of oxygen, 50 ppma of carbon, 1 ppma of copper, 2 ppma of nickel and 16 ppma of iron together with a trace amount of a dopant element. While filling the atmosphere inside the furnace with argon, the crucible was heated by high-frequency induction to melt the silicon particles in the crucible.

When the melt of silicon appeared in the orifice of the crucible, a seed crystal, of which the crystallographic orientation was <111> in the axial direction, was brought from below into contact with the melt of silicon appearing in the orifice and then moved downwardly at an average descending velocity of 2.2 mm/minute under monitoring of the solid-liquid interface by means of a CCD camera so as to control the pulling-down velocity of the seed crystal and the high-frequency power input which was at about 85 amperes and 60 volts in order to accomplish a target diameter 0.500 mm of the wire-formed crystalline silicon.

The wire-formed single crystal silicon having a diameter of 0.52±0.025 mm thus obtained also had a crystallographic orientation of <111> in the lengthwise direction and contained 30 ppma of oxygen, 20 ppma of carbon, 1 ppma of copper, 1 ppma of nickel and 10 ppma of iron. The resistivity thereof was 0.2 ohm·cm and the tensile strength was 7.2 kgf/mm$^2$.

COMPARATIVE EXAMPLE 2

The experimental procedure was substantially the same as in Comparative Example 1 except that the seed crystal had a crystallographic orientation of <100> in the axial direction. The wire-formed crystalline silicon having a diameter of 0.35±0.015 mm thus obtained also had a crystallographic orientation of <100> in the lengthwise direction. The resistivity thereof was 0.2 ohm·cm and the tensile strength was 6.0 kgf/mm$^2$.

What is claimed is:

1. A method for the preparation of a wire-formed crystal of silicon having a diameter not exceeding 1 mm which comprises the steps of:

(a) holding a rod of silicon in a vertical disposition;

(b) melting an end portion of the vertically held rod of silicon by heating with a high frequency induction;

(c) bringing a seed crystal of silicon into contact with the molten end portion of the vertically held rod of silicon to cause melt-bonding therebetween; and (d) pulling apart the seed crystal and the vertically held rod of silicon in the vertical direction relative to each other so as to effect solidification and crystallization of the molten silicon as drawn by the seed crystal.

2. The method for the preparation of a wire-formed crystal of silicon having a diameter not exceeding 1 mm as claimed in claim 1 in which the end portion of the rod of silicon is the lower end portion thereof.

3. The method for the preparation of a wire-formed crystal of silicon having a diameter not exceeding 1 mm as claimed in claim 1 in which the rod of silicon and the seed crys-tal of silicon are rotated relative to each other around the vertical axis.

4. The method for the preparation of a wire-formed crystal of silicon having a diameter not exceeding 1 mm as claimed in claim 1 in which the ratio of the diameter of the wire-formed crystal of silicon to the diameter of the rod of silicon is in the range from 1:100 to 1:1.

5. The method for the preparation of a wire-formed crystal of silicon having a diameter not exceeding 1 mm as claimed in claim 4 in which the ratio of the diameter of the wire-formed crystal of silicon to the diameter of the rod of silicon is in the range from 1:20 to 1:5.

6. The method for the preparation of a wire-formed crystal of silicon having a diameter not exceeding 1 mm as claimed in claim 1 in which the state of the solid-melt interface between the molten end portion of the rod of silicon and the already formed wire-formed crystal of silicon is monitored so as to adjust the pulling-apart velocity of the seed crystal and the vertically held rod of silicon or the electric power input for the high-frequency induction heating.

7. The method for the preparation of a wire-formed crystal of silicon having a diameter not exceeding 1 mm as claimed in claim 1 in which the total content of impurities contained in the rod of silicon does not exceed 0.1 atomic %.

8. The method for the preparation of a wire-formed crystal of silicon having a diameter not exceeding 1 mm as claimed in claim 1 which is performed in an atmosphere of an inert gas.

9. The method for the preparation of a wire-formed crystal of silicon having a diameter not exceeding 1 mm as claimed in claim 8 in which the inert gas is selected from the group consisting of argon, helium and nitrogen.

10. The method for the preparation of a wire-formed crystal of silicon having a diameter not exceeding 1 mm as claimed in claim 8 in which the total content of impurities contained in the inert gas does not exceed 1000 ppm.

11. The method for the preparation of a wire-formed crystal of silicon having a diameter not exceeding 1 mm as claimed in claim 8 in which the content of moisture contained in the inert gas does not exceed $10^{-3}$ atmosphere calculated as the vapor pressure of water at 25° C.

12. The method for the preparation of a wire-formed crystal of silicon having a diameter not exceeding 1 mm as claimed in claim 1 which is performed in an atmosphere under a reduced pressure.

13. The method for the preparation of a wire-formed crystal of silicon having a diameter not exceeding 1 mm as claimed in claim 1 which is performed in an atmosphere of vacuum.

* * * * *